United States Patent
Kubota

(10) Patent No.: US 8,432,946 B2
(45) Date of Patent: Apr. 30, 2013

(54) NITRIDE SEMICONDUCTOR LASER DIODE

(75) Inventor: Masashi Kubota, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/314,251

(22) Filed: Dec. 5, 2008

(65) Prior Publication Data

US 2009/0161711 A1 Jun. 25, 2009

(30) Foreign Application Priority Data

Dec. 6, 2007 (JP) ................................ 2007-316044

(51) Int. Cl.
*H01S 3/04* (2006.01)

(52) U.S. Cl.
USPC ................. 372/43.01; 372/46.01; 372/49.01

(58) Field of Classification Search ......... 372/43–45.01, 372/46.01, 49.01, 75, 98–991
See application file for complete search history.

(56) References Cited

U.S. PATENT DOCUMENTS

| | | | | |
|---|---|---|---|---|
| 7,285,799 B2 * | 10/2007 | Kim et al. | ......................... | 257/79 |
| 7,315,559 B2 * | 1/2008 | Dwilinski et al. | ......... | 372/49.01 |
| 2002/0054617 A1 * | 5/2002 | Tsuda et al. | .................... | 372/46 |
| 2003/0103542 A1 * | 6/2003 | Cox et al. | ........................ | 372/96 |
| 2006/0268953 A1 * | 11/2006 | Ikedo et al. | ................ | 372/43.01 |
| 2007/0177646 A1 * | 8/2007 | Sogabe et al. | ............. | 372/49.01 |
| 2007/0211776 A1 * | 9/2007 | Yoshida et al. | ............ | 372/49.01 |

FOREIGN PATENT DOCUMENTS

| | | |
|---|---|---|
| JP | 2007-165405 A | 6/2007 |
| JP | 2009-123969 A | 6/2009 |

OTHER PUBLICATIONS

Shuji Nakamura et al.: "InGaN-Based Multi-Quantum-Well-Structure Laser Diodes" Department of Research and Development, Nichia Chemical Industries, Ltd., 491 Oka, Kaminaka, Anan, Tokushima 774, Japan; Jpn. J. Appl. Phys. vol. 35 (1996) pp. L74-L76, Part 2, No. 1B, Jan. 15, 1996.

T. Onuma et al.: "Exciton spectra of an AlN epitaxial film on (0001) sapphire substrate grown by low-pressure metalorganic vapor phase epitaxy" Institute of Applied Physics, University of Tsukuba, 1-1-1 Tennodai, Tsukuba, Ibaraki 305-8573, Japan, Department of Electrical, Electronics, and Computer Engineering, Waseda University, 3-4-1 Ohkubo, Shinjuku, Tokyo 169-8555, Japan, NGK Insulators, Limited, 2-56 Suda-cho, Mizuho-ku, Nagoya 467-8530, Japan; Applied Physics Letters, vol. 81, No. 4, Jul. 22, 2002.

Yoshitaka Taniyasu et al.: "Radiation and polarization properties of free-exciton emission from AlN (0001) surface" NTT Basic Research Laboratories, NTT Corporation, 3-1 Morinosato-Wakamiya, Atsugi 243-0198, Japan; Applied Physics Letters 90, 261911 (2007).

* cited by examiner

*Primary Examiner* — Xinning Niu

(74) *Attorney, Agent, or Firm* — Rabin & Berdo, P.C.

(57) ABSTRACT

A nitride semiconductor laser diode has a quantum well layer consisting of a mixed crystal of $Al_{x1}In_{y1}Ga_{1-x1-y1}N$ ($x1 \geq 0.5$, $y1 \geq 0$ and $1-x1-y1 \leq 0.5$) in a group III nitride semiconductor multilayer structure having a major growth surface defined by a nonpolar plane. A cavity direction of the laser diode is perpendicular to a c-axis. The major growth surface of the group III nitride semiconductor multilayer structure may be defined by an m-plane. In this case, the cavity direction may be along an a-axis.

16 Claims, 5 Drawing Sheets

NITRIDE SEMICONDUCTOR LASER DIODE

BACKGROUND OF THE INVENTION

1. Field of the Invention

The present invention relates to a nitride semiconductor laser diode including a semiconductor multilayer structure made of group III nitride semiconductors.

2. Description of Related Art

Group III-V semiconductors employing nitrogen as a group V element are called "group III nitride semiconductors", and typical examples thereof include aluminum nitride (AlN), gallium nitride (GaN) and indium nitride (InN), which can be generally expressed as $Al_xIn_yGa_{1-x-y}N$ ($0 \leq X \leq 1$, $0 \leq Y \leq 1$ and $0 \leq X+Y \leq 1$).

Short wavelength laser sources such as blue and green laser sources are increasingly employed in the fields of high-density recording in optical disks represented by a DVD, image processing, medical instruments, measuring instruments and the like. Such a short wavelength laser source is constituted of a laser diode employing GaN semiconductors, for example.

A GaN semiconductor laser diode is manufactured by growing group III nitride semiconductors on a gallium nitride (GaN) substrate having a major surface defined by a c-plane by metal-organic vapor phase epitaxy (MOVPE). More specifically, an n-type GaN contact layer, an n-type AlGaN cladding layer, an n-type GaN guide layer, an active layer (light emitting layer), a p-type GaN guide layer, a p-type AlGaN cladding layer and a p-type GaN contact layer are successively grown on the GaN substrate by the metal-organic vapor phase epitaxy, to form a semiconductor multilayer structure consisting of these semiconductor layers. The active layer emits light by recombination of electrons and positive holes injected from the n-type layer and the p-type layer respectively. This light is confined between the n-type AlGaN cladding layer and the p-type AlGaN cladding layer, and is propagated in a direction perpendicular to a stacking direction of the semiconductor multilayer structure. Cavity end faces are formed on both ends in the propagation direction, so that the light is resonantly amplified while repeating induced emission between the pair of cavity end faces and part thereof is emitted from either cavity end face as the laser beam.

One of important characteristics of the semiconductor laser diode is a threshold current (oscillation threshold) for causing laser oscillation. The energy efficiency of laser oscillation is improved as the threshold current is reduced.

However, the light emitted from the light emitting layer grown on the major surface defined by the c-plane is randomly polarized, and hence the ratio of the light contributing oscillation of a TE mode is small. Therefore, the efficiency of laser oscillation is not necessarily excellent but must be improved for reducing the threshold current.

SUMMARY OF THE INVENTION

An object of the present invention is to provide a nitride semiconductor laser diode capable of improving laser oscillation efficiency and reducing a threshold current.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
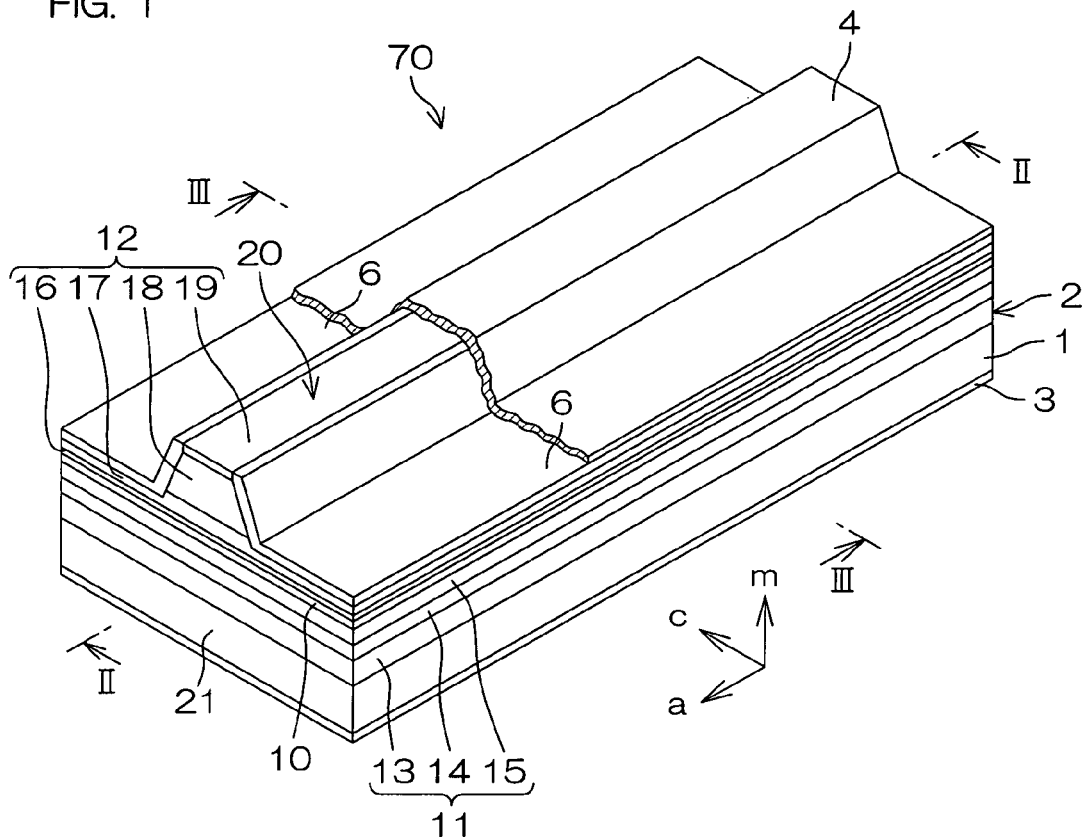
FIG. 1 is a perspective view for illustrating the structure of a nitride semiconductor laser diode according to an embodiment of the present invention.

A nitride semiconductor laser diode according to an embodiment of the present invention has a quantum well layer consisting of a mixed crystal of $Al_xIn_yGa_{1-x-y}N$ ($x \geq 0.5$, $y \geq 0$ and $1-x-y \leq 0.5$) in a group III nitride semiconductor multilayer structure having a major growth surface defined by a nonpolar plane (an m-plane or an a-plane), with a cavity direction is set perpendicular to a c-axis (preferably, parallel to the major growth surface and perpendicular to the c-axis).

No report has heretofore been made as to a prototype example of a nitride semiconductor laser diode including a quantum well layer made of a group III nitride semiconductor such as AlGaN, AlInGaN or AlInN having a composition containing Al and operating with a wavelength of not more than 365 nm.

The inventor of the present invention has manufactured a prototype semiconductor laser diode having a multiple quantum well layers including a quantum well layer comprising of a mixed crystal of $Al_xIn_yGa_{1-x-y}N$ ($x \geq 0.5$, $y \geq 0$ and $1-x-y \leq 0.5$) in a group III nitride semiconductor multilayer structure having a major surface defined by a c-plane. Then, it has been recognized that a main direction of polarization (electric field direction) is parallel to the c-axis direction, and hence oscillation in a TE mode hardly takes place.

In one embodiment of the present invention, therefore, a laser structure is constituted of a group III nitride semiconductor multilayer structure having a major growth surface defined by a nonpolar plane, and this group III nitride semiconductor multilayer structure includes a quantum well layer comprising of a group III nitride semiconductor (mixed crystal of $Al_xIn_yGa_{1-x-y}N$ ($x \geq 0.5$, $y \geq 0$ and $1-x-y \leq 0.5$)) having an Al composition of not less than 50% therein, while a cavity direction is set perpendicular to a c-axis. Thus, a main direction of polarization of light emitted from the quantum well layer is parallel to the c-axis direction, and this light is propagated in the cavity direction perpendicular to the c-axis. Oscillation in a TE mode can be easily caused in this manner, whereby the threshold current can be reduced.

In the quantum well layer having the major growth surface defined by the nonpolar plane, anisotropic strain is caused in the plane. This is because the group III nitride semiconductor has an orthohexagonal prism crystal structure along the c-axis direction, and a c-axis length and an a-axis length are different from each other. In other words, anisotropic in-plane strain is applied from an underlayer due to the difference between the c-axis length and the a-axis length. The effective mass of a valence band is reduced due to this anisotropic strain, to increase an optical gain as a result. Thus, oscillation efficiency can be further improved, and the threshold current is reduced.

More specifically, the major growth surface of the group III nitride semiconductor multilayer structure may be defined by an m-plane, and the cavity direction may be along the a-axis in the nitride semiconductor laser diode.

Further specifically, the nitride semiconductor laser diode may include a group III nitride semiconductor multilayer structure, made of group III nitride semiconductors having major surfaces of crystal growth defined by m-planes, formed by stacking an n-type cladding layer, a light emitting layer including the quantum well layer and a p-type cladding layer in the m-axis direction. In this case, the group III nitride semiconductors are preferably crystal-grown on a group III nitride semiconductor monocrystalline substrate (GaN monocrystalline substrate, for example) having a growth surface for crystal growth defined by an m-plane. At this time, an offset angle of the major surface of the group III nitride semiconductor monocrystalline substrate is preferably within ±1°.

More specifically, the major growth surface of the group III nitride semiconductor multilayer structure may be defined by an m-plane, and the cavity direction may be along the a-axis, for example, in the nitride semiconductor laser diode.

Further specifically, the nitride semiconductor laser diode may include a group III nitride semiconductor multilayer structure, made of group III nitride semiconductors having major surfaces of crystal growth defined by a-planes, formed by stacking an n-type cladding layer, a light emitting layer including the quantum well layer and a p-type cladding layer in the a-axis direction. In this case, the group III nitride semiconductors are preferably crystal-grown on a group III nitride semiconductor monocrystalline substrate (GaN monocrystalline substrate, for example) having a growth surface for crystal growth defined by an a-plane. At this time, an offset angle of the major surface of the group III nitride semiconductor monocrystalline substrate is preferably within ±1°.

The group III nitride semiconductor multilayer structure may include a p-type semiconductor layer including the p-type cladding layer. In this case, the nitride semiconductor laser diode may further include a p-type electrode formed along a direction perpendicular to the c-axis in contact with the p-type semiconductor layer on a striped contact region, and a pair of cavity end faces may be formed perpendicularly to the direction of the stripes of the contact region.

The group III nitride semiconductor multilayer structure may include a p-type semiconductor layer including the p-type cladding layer, stripes along the direction perpendicular to the c-axis may be formed by partially removing the p-type semiconductor layer, and a pair of cavity end faces may be formed perpendicularly to the direction of the stripes.

The embodiment of the present invention is now described in more detail with reference to the attached drawings.

Figure 2:
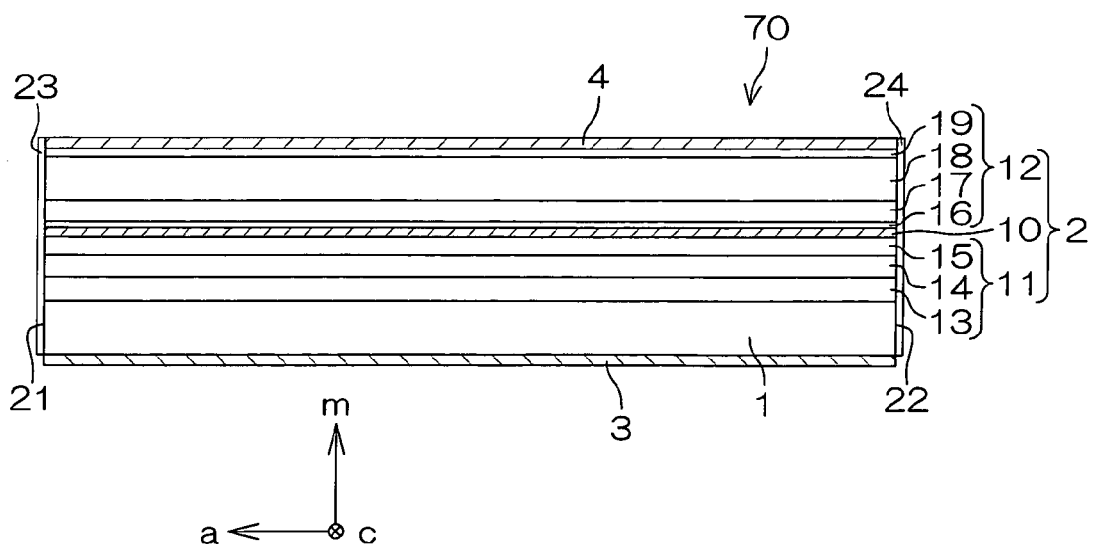
FIG. 2 is a longitudinal sectional view taken along a line II-II in FIG. 1.
Figure 3:
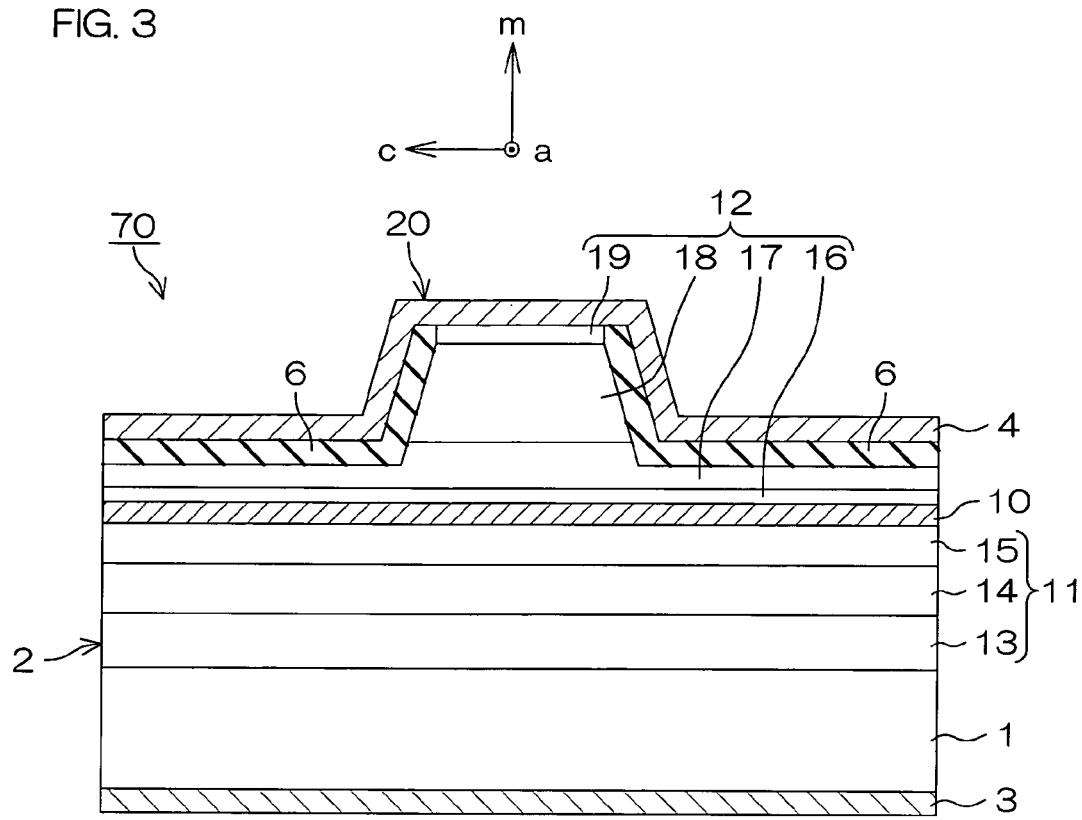
FIG. 3 is a cross sectional view taken along a line III-III in FIG. 1.

FIG. 1 is a perspective view for illustrating the structure of a nitride semiconductor laser diode according to the embodiment of the present invention, FIG. 2 is a longitudinal sectional view taken along a line II-II in FIG. 1, and FIG. 3 is a cross sectional view taken along a line III-III in FIG. 1.

This semiconductor laser diode 70 is a Fabry-Perot laser diode including a substrate 1, a group III nitride semiconductor multilayer structure 2 formed on the substrate 1 by crystal growth, an n-type electrode 3 formed to be in contact with a back surface (a surface opposite to the group III nitride semiconductor multilayer structure 2) of the substrate 1 and a p-type electrode 4 formed to be in contact with the surface of the group III nitride semiconductor multilayer structure 2.

According to this embodiment, the substrate 1 is formed by a GaN monocrystalline substrate. The substrate 1 has a major surface defined by an m-plane, and the group III nitride semiconductor multilayer structure 2 is formed by crystal growth on this major surface. Therefore, the group III nitride semiconductor multilayer structure 2 is made of group III nitride semiconductors having major growth surfaces defined by m-planes.

The group III nitride semiconductor multilayer structure 2 includes a light emitting layer 10, an n-type semiconductor layered portion 11 and a p-type semiconductor layered portion 12. The n-type semiconductor layered portion 11 is disposed on a side of the light emitting layer 10 closer to the substrate 1, while the p-type semiconductor layered portion 12 is disposed on a side of the light emitting layer 10 closer to the p-side electrode 4. Thus, the light emitting layer 10 is held between the n-type semiconductor layered portion 11 and the p-type semiconductor layered portion 12, whereby a double heterojunction structure is provided. Electrons and positive holes are injected into the light emitting layer 10 from the n-type semiconductor layered portion 11 and the p-type semiconductor layered portion 12 respectively. The electrons and the positive holes are recombined in the light emitting layer 10, to emit light.

The n-type semiconductor layered portion 11 is formed by successively stacking an n-type AlGaN contact layer 13 (having a thickness of about 2 µm, for example), an n-type AlGaN cladding layer 14 (having a thickness of not more than 1.5 µm such as a thickness of 1.0 µm, for example) and an n-type AlGaN guide layer 15 (having a thickness of 0.1 µm, for example) from the side closer to the substrate 1. On the other hand, the p-type semiconductor layered portion 12 is formed by successively stacking a p-type AlGaN electron blocking layer 16 (having a thickness of 20 nm, for example), a p-type AlGaN guide layer 17 (having a thickness of 0.1 µm, for example), a p-type AlGaN cladding layer 18 (having a thickness of not more than 1.5 µm such as a thickness of 0.4 µm, for example) and a p-type GaN contact layer 19 (having a thickness of 0.3 µm, for example) on the light emitting layer 10.

The n-type AlGaN contact layer 13 is a low-resistance layer. The p-type GaN contact layer 19 is a low-resistance layer for attaining ohmic contact with the p-type electrode 4. The n-type AlGaN contact layer 13 is made of an n-type semiconductor prepared by doping AlGaN with Si, for example, serving as an n-type dopant in a high doping concentration ($3 \times 10^{18}$ cm$^{-3}$, for example). The p-type GaN contact layer 19 is made of a p-type semiconductor prepared by doping GaN with Mg serving as a p-type dopant in a high doping concentration ($3 \times 10^{19}$ cm$^{-3}$, for example).

The n-type AlGaN cladding layer 14 and the p-type AlGaN cladding layer 18 provide a light confining effect confining the light emitted by the light emitting layer 10 therebetween. The n-type AlGaN cladding layer 14 is made of an n-type semiconductor prepared by doping AlGaN with Si, for example, serving as an n-type dopant (in a doping concentration of $1 \times 10^{18}$ cm$^{-3}$, for example). The p-type AlGaN cladding layer 18 is made of a p-type semiconductor prepared by doping AlGaN with Mg serving as a p-type dopant (in a doping concentration of $1 \times 10^{19}$ cm$^{-3}$, for example). The n-type AlGaN cladding layer 14 has a larger band gap than the n-type AlGaN guide layer 15, and the p-type AlGaN cladding layer 18 has a larger band gap than the p-type AlGaN guide layer 17. Thus, the light can be excellently confined, to provide the semiconductor laser diode with a low threshold and high efficiency.

The n-type AlGaN guide layer 15 and the p-type AlGaN guide layer 17 are semiconductor layers providing a carrier confining effect for confining carriers (electrons and positive holes) in the light emitting layer 10. Thus, the efficiency of recombination of the electrons and the positive holes is improved in the light emitting layer 10. The n-type AlGaN guide layer 15 is made of an n-type semiconductor prepared by doping AlGaN with Si, for example, serving as an n-type dopant (in a doping concentration of $1 \times 10^{18}$ $cm^{-3}$, for example), and the p-type AlGaN guide layer 17 is made of a p-type semiconductor prepared by doping AlGaN with Mg, for example, serving as a p-type dopant (in a doping concentration of $5 \times 10^{18}$ $cm^{-3}$, for example).

The p-type AlGaN electron blocking layer 16 is made of a p-type semiconductor prepared by doping AlGaN with Mg, for example, serving as a p-type dopant (in a doping concentration of $5 \times 10^{18}$ $cm^{-3}$, for example), and improves the efficiency of recombination of the electrons and the positive holes by preventing the electrons from flowing out of the light emitting layer 10.

Figure 4:
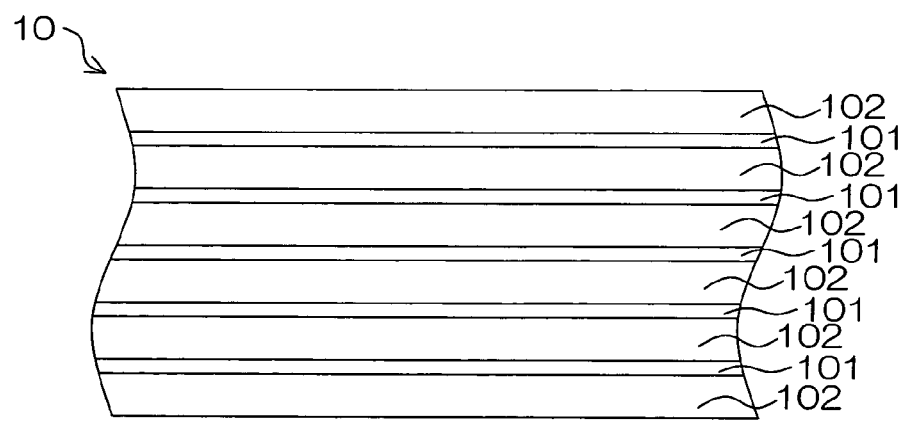
FIG. 4 is a schematic enlarged sectional view for illustrating the structure of a light emitting layer.

The light emitting layer 10, having an MQW (multiple-quantum well) structure containing AlGaN, is a layer for emitting light by recombination of the electrons and the positive holes and amplifying the emitted light. More specifically, the light emitting layer 10 is formed by alternately repetitively stacking AlGaN layers 101 (each having a thickness of 3 nm, for example) as quantum well layers and AlGaN layers 102 (each having a thickness of 9 nm, for example) as barrier layers by a plurality of cycles, as schematically shown in FIG. 4. In this case, the Al composition ratio in the AlGaN layers 101 is set to not less than 50%, so that a polarization component parallel to the c-axis is dominant in light emitted from the AlGaN layers 101. The AlGaN layers 101 and the AlGaN layers 102 are alternately repetitively stacked by two to seven cycles, for example, to constitute the light emitting layer 10 having the MQW structure. The emission wavelength is set to 205 nm to 275 nm, and belongs to the ultraviolet region. In other words, the semiconductor laser diode 70 is an ultraviolet laser oscillating in the ultraviolet region. The emission wavelength can be adjusted by adjusting the Al composition in the AlGaN layers 101. The AlGaN layers 102 as the barrier layers are made of AlGaN having a higher Al concentration than the AlGaN layers 101.

The composition of the AlGaN layers 101 (quantum well layers) can be expressed as $Al_{X1}Ga_{1-X1}N$. The composition of the AlGaN layers 102 (barrier layers) can be expressed as $Al_{X2}Ga_{1-X2}N$. In this case, X1>0.5, and X1<X2.

The p-type semiconductor layer 12 is partially removed, to form a ridge stripe 20. More specifically, the p-type contact layer 19, the p-type AlGaN cladding layer 18 and the p-type AlGaN guide layer 17 are partially removed by etching, to form the ridge stripe 20 having a generally trapezoidal (mesa) shape in cross sectional view. This ridge stripe 20 is formed along an a-axis direction perpendicular to the c-axis. Therefore, the cavity direction is along the a-axis direction.

The group III nitride semiconductor multilayer structure 2 has a pair of end faces 21 and 22 (cleavage planes) formed by cleaving both longitudinal ends of the ridge stripe 20. The pair of end faces 21 and 22 are parallel to each other, and both of the end faces 21 and 22 are perpendicular to the a-axis. Thus, the n-type AlGaN guide layer 15, the light emitting layer 10 and the p-type AlGaN guide layer 17 constitute a Fabry-Perot cavity along the a-axis direction with the end faces 21 and 22 serving as the cavity end faces. In other words, the light emitted in the light emitting layer 10 reciprocates between the cavity end faces 21 and 22, and is amplified by induced emission. Part of the amplified light is extracted from the cavity end faces 21 and 22 as the laser beam.

As hereinabove described, the polarization component parallel to the c-axis is dominant in the light emitted from the AlGaN layers 101 as the quantum well layers. The major growth surface of the group III nitride semiconductor multilayer structure 2 is defined by the m-plane, and the cavity direction is along the a-axis direction. Therefore, the light can be excellently confined between the cladding layers 14 and 18, and propagation of this light in the cavity direction (a-axis direction) can be prompted. Thus, oscillation in the TE mode can be easily caused. Therefore, the oscillation efficiency is so improved that the threshold current can be effectively reduced (see FIG. 6 described later).

The n-type electrode 3 made of Al metal, for example, and the p-type electrode 4 made of Al metal or a Pd/Au alloy, for example, are in ohmic contact with the p-type contact layer 19 and the substrate 1 respectively. Insulating layers 6 covering the exposed surfaces of the p-type AlGaN guide layer 17 and the p-type AlGaN cladding layer 18 are provided such that the p-type electrode 4 is in contact with only the p-type GaN contact layer 19 provided on a top face (striped contact region) of the ridge stripe 20. Thus, a current can be concentrated on the ridge stripe 20, thereby enabling efficient laser oscillation. The regions of the surface of the ridge stripe 20 excluding the portion in contact with the p-type electrode 4 are covered with and protected by the insulating layers 6, whereby lateral light confinement can be softened and easily controlled, and leakage currents from the side surfaces can be prevented. The insulating layers 6 can be made of an insulating material such as $SiO_2$ or $ZrO_2$, for example, having a refractive index greater than 1.

The top face of the ridge stripe 20 is defined by an m-plane, and the p-type electrode 4 is formed on this m-plane. A back surface of the substrate 1 provided with the n-type electrode 3 is also defined by an m-plane. Thus, both of the p-type electrode 4 and the n-type electrode 3 are formed on the m-planes, whereby a high laser output and reliability for sufficiently withstanding a high-temperature operation can be implemented.

The cavity end faces 21 and 22 are covered with insulating films 23 and 24 (not shown in FIG. 1) respectively. Both of the cavity end faces 21 and 22 are defined by a-planes.

Figure 5:
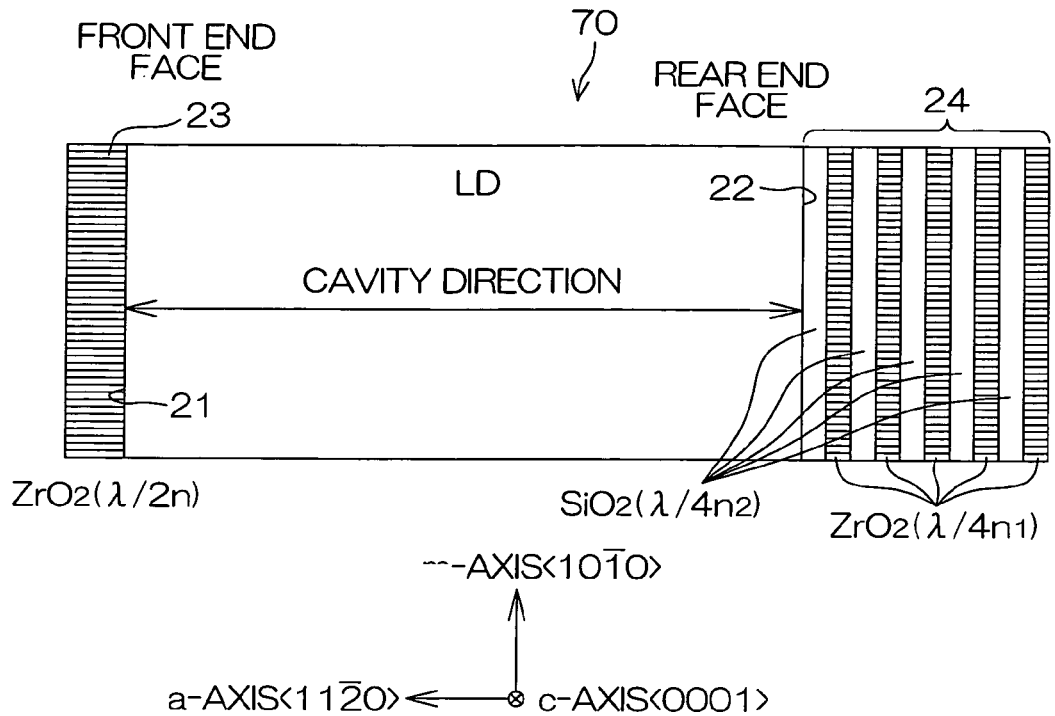
FIG. 5 is a schematic diagram for illustrating the structures of insulating films (reflecting films) formed on cavity end faces.

As schematically shown in FIG. 5, the insulating film 23 formed to cover the cavity end face 21 is constituted of a single film of $ZrO_2$, for example. On the other hand, the insulating film 24 formed on the cavity end face 22 is constituted of a multiple reflecting film formed by alternately repetitively stacking $SiO_2$ films and $ZrO_2$ films a plurality of times (five times in the example shown in FIG. 5), for example. The thickness of the single $ZrO_2$ film constituting the insulating film 23 is set to $\lambda/2n_1$ (where $\lambda$ represents the emission wavelength of the light emitting layer 10 and $n_1$ represents the refractive index of $ZrO_2$). On the other hand, the multiple reflecting film constituting the insulating film 24 is formed by alternately stacking the $SiO_2$ films each having a thickness of $\lambda/4n_2$ (where $n_2$ represents the refractive index of $SiO_2$) and the $ZrO_2$ films each having a thickness of $\lambda/4n_1$. Both of the insulating films 23 and 24 form films having small light absorption in the ultraviolet region.

According to this structure, the cavity end face 21 has small reflectivity, while the cavity end face 22 has large reflectivity. More specifically, the reflectivity of the cavity end face 21 is about 20%, while the reflectivity of the cavity end face 22 is about 99.5% (generally 100%), for example. Therefore, the cavity end face 21 emits a larger quantity of laser output. In other words, the cavity end face 21 serves as a laser emitting end face in this semiconductor laser diode 70.

According to this structure, light dominated by the polarization component parallel to the c-axis can be emitted by connecting the n-type electrode 3 and the p-type electrode 4 to a power source and injecting the electrons and the positive holes into the light emitting layer 10 from the n-type semiconductor layered portion 11 and the p-type semiconductor layered portion 12 respectively thereby recombining the electrons and the positive holes in the light emitting layer 10. This light reciprocates between the cavity end faces 21 and 22 along the guide layers 15 and 17, and is amplified by induced emission. Thus, a larger quantity of laser output is extracted from the cavity end face 21 serving as the laser emitting end face.

The semiconductor laser diode 70 as an ultraviolet laser can be employed in the fields of high-density recording in an optical disk, image processing, medical instruments, measuring instruments, optical communication and the like. In particular, the semiconductor laser diode 70 can be employed as a light source for curing a dermatosis in the medical field, and can be employed as a light source for very-short-range communication in the field of optical communication.

Figure 6:
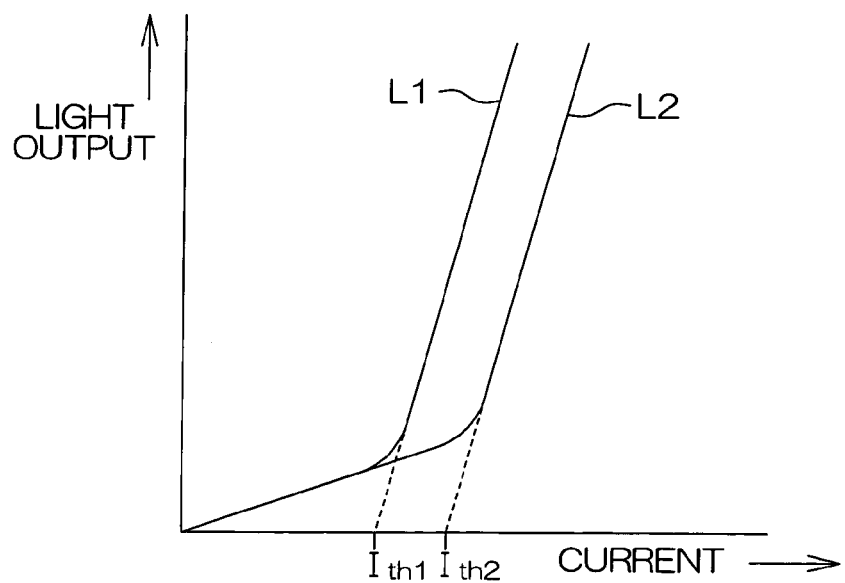
FIG. 6 is a diagram for illustrating reduction of a threshold current.

FIG. 6 is a diagram for illustrating reduction of the threshold current. A curve L1 shows the current-light output characteristics of the device according to this embodiment with the cavity direction (direction of the ridge stripe 20) set along the a-axis. A curve L2 shows the current-light output characteristics of a device according to comparative example with a cavity direction (direction of the ridge stripe 20) set along the c-axis. Comparing the curves L1 and L2 with each other, it is understood that the threshold current $I_{th1}$ of the device according to this embodiment is remarkably reduced as compared with the threshold current $I_{th2}$ of the device according to the comparative example.

Figure 7:
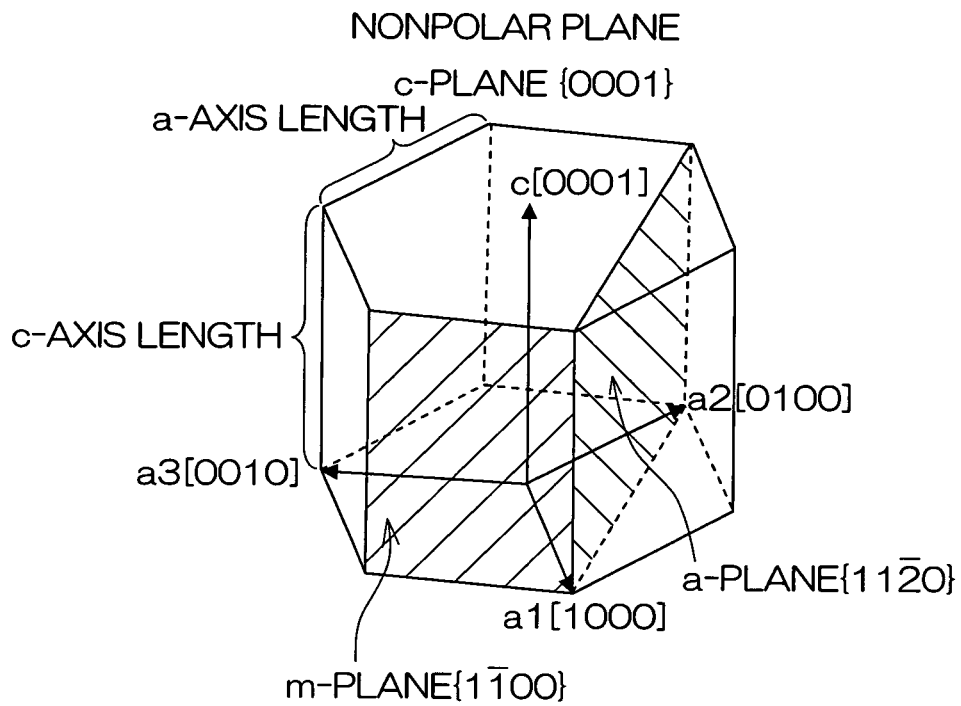
FIG. 7 is a schematic diagram showing a unit cell of a crystal structure of a group III nitride semiconductor.
Figure 7:
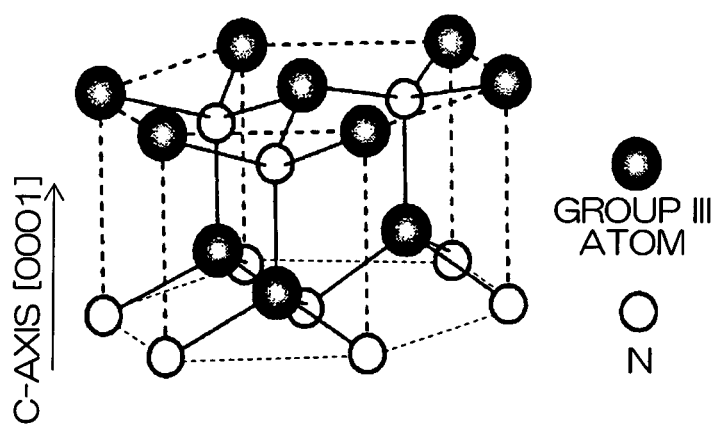

FIG. 7 is a schematic diagram showing a unit cell of the crystal structure of a group III nitride semiconductor. The crystal structure of the group III nitride semiconductor can be approximated by a hexagonal system, in which four nitrogen atoms are bonded to each group III atom. The four nitrogen atoms are located on the four vertices of a regular tetrahedron having the group III atom at the center thereof. One of the four nitrogen atoms is located in the +c-axis direction with respect to the group III atom, while the remaining three nitrogen atoms are located on the −c-axis side with respect to the group III atom. In the group III nitride semiconductor, the direction of polarization is along the c-axis due to this structure.

The c-axis is along the axial direction of a hexagonal prism, and a surface (top face of the hexagonal prism) having the c-axis as the normal is the c-plane (0001). When the crystal of the group III nitride semiconductor is cleaved along two planes parallel to the c-plane, group III atoms align along the crystal plane (+c-plane) defining the surface on the +c-axis side, while nitrogen atoms align along the crystal plane (−c-plane) defining the surface on the −c-axis side. Therefore, the c-plane, exhibiting different properties on the +c-axis side and the −c-axis side respectively, is referred to as a polar plane.

On the other hand, the side surfaces of the hexagonal prism are m-planes (10-10) respectively, and a surface passing through a pair of unadjacent ridges is an a-plane (11-20). These crystal planes, perpendicular to the c-plane and orthogonal to the direction of polarization, are planes having no polarity, i.e., nonpolar planes.

The axial length of the crystal structure depends on the composition of the group III nitride semiconductor. When a group III nitride semiconductor layer having a different composition is crystal-grown on an underlayer of the group III nitride semiconductor, the upper group III nitride semiconductor layer is crystal-grown while lattice-matching with the underlayer. Therefore, the group III nitride semiconductor layer is strained in the in-plane direction. In the c-plane, each atom is arranged on each vertex of the orthohexagon, and hence in-plane direction strain is isotropic when the major growth surface is defined by the c-plane. On the other hand, the a-axis length and the c-axis length vary with the composition of the group III nitride semiconductor, and the axial length ratio c/a between the a-axis length and the c-axis length also varies with the composition of the group III nitride semiconductor. When the major growth surface is defined by the m-plane, therefore, the in-plane direction strain is anisotropic.

It is known that the effective mass of a valence band is reduced when anisotropic strain is applied to a quantum well layer, thereby attaining an effect of increasing an optical gain. Therefore, the semiconductor laser diode 70 provided with the group III nitride semiconductor multilayer structure 2 having the major growth surface defined by the m-plane and including the multiple quantum well layer arranged therein can attain excellent oscillation efficiency.

The GaN monocrystalline substrate having the major surface defined by the m-plane can be cut from a GaN monocrystalline having a major surface defined by a c-plane, for example. The m-plane of the cut substrate is polished by chemical mechanical polishing, for example, so that azimuth errors related to both of (0001) and (11-20) directions are within ±1° (preferably within ±0.3°). Thus, a GaN monocrystalline substrate having a major surface defined by an m-plane with no crystal defects such as dislocations and stacking faults is obtained. Only steps of the atomic level are formed on the surface of this GaN monocrystalline substrate.

The group III nitride semiconductor multilayer structure 2 comprising a semiconductor laser diode structure is grown on the GaN monocrystalline substrate obtained in this manner by metal-organic vapor phase epitaxy.

When the group III nitride semiconductor multilayer structure 2 having the major growth surface defined by the m-plane is grown on the GaN monocrystalline substrate 1 having the major surface defined by the m-plane and a section along the a-plane is observed with an electron microscope (STEM: scanning transmission electron microscope), no striations showing presence of dislocations are observed on the group III nitride semiconductor multilayer structure 2. When the surface state thereof is observed with an optical microscope, it is understood that planarity in the c-axis direction (difference between the heights of rearmost and lowermost portions) is within 10 Å. This also applies to planarity in the a-axis direction. This indicates that the planarity of the light emitting layer 10, particularly the quantum well layers, in the a-axis direction is within 10 Å. Thus, the half width of the emission spectrum can be reduced.

Thus, dislocation-free m-plane group III nitride semiconductors having planar stacking interfaces can be grown. However, the offset angle of the major surface of the GaN monocrystalline substrate 1 is preferably set to within ±1° (more preferably, within ±0.3°). If a GaN semiconductor layer is grown on an m-plane GaN monocrystalline substrate having an offset angle of 2°, for example, a GaN crystal may be grown in such a terraced manner that no planar surface state can be obtained dissimilarly to the case of setting the offset angle to within ±1°.

Figure 8:
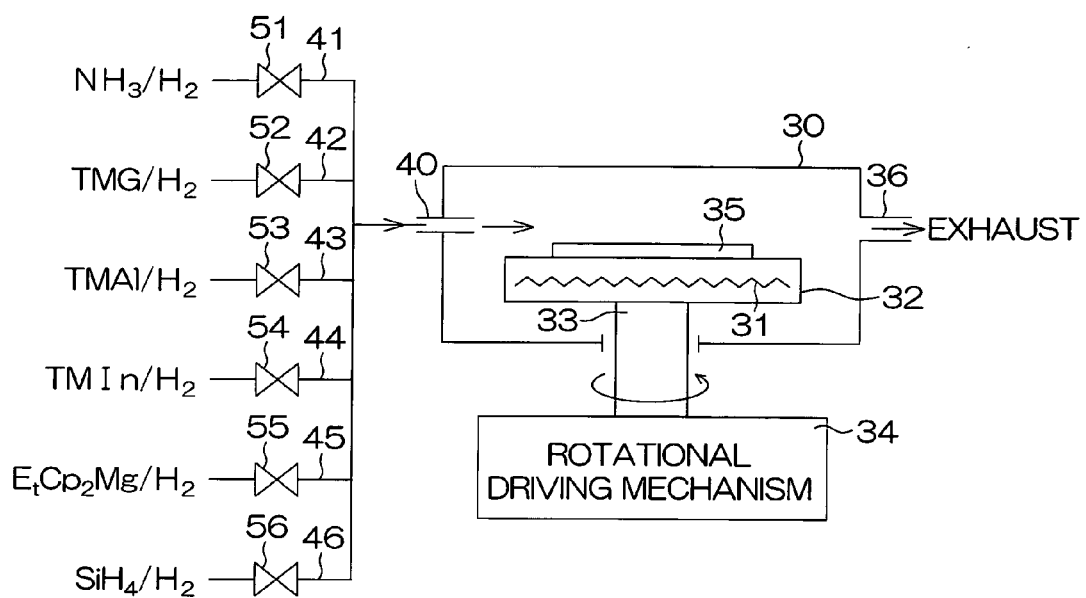
FIG. 8 is a schematic diagram for illustrating the structure of a treating apparatus for growing layers constituting a group III nitride semiconductor multilayer structure.

FIG. 8 is a schematic diagram for illustrating the structure of a treating apparatus for growing the layers constituting the group III nitride semiconductor multilayer structure 2. A susceptor 32 storing a heater 31 is arranged in a treating chamber 30. The susceptor 32 is coupled to a rotating shaft 33, which is rotated by a rotational driving mechanism 34 arranged outside the treating chamber 30. Thus, the susceptor 32 so holds a wafer 35 to be treated that the wafer 35 can be heated to a prescribed temperature and rotated in the treating chamber 30. The wafer 35 is a GaN monocrystalline wafer constituting the aforementioned GaN monocrystalline substrate.

An exhaust pipe 36 is connected to the treating chamber 30. The exhaust pipe 36 is connected to an exhaust unit such as a rotary pump. Thus, the pressure in the treating chamber 30 is set to 1/10 atm. to ordinary pressure, and the atmosphere in the treating chamber 30 is regularly exhausted.

On the other hand, a source gas feed passage 40 for feeding source gas toward the surface of the wafer 35 held by the susceptor 32 is introduced into the treating chamber 30. A nitrogen material pipe 41 feeding ammonia as nitrogen source gas, a gallium material pipe 42 feeding trimethyl gallium (TMG) as gallium source gas, an aluminum material pipe 43 feeding trimethyl aluminum (TMAl) as aluminum source gas, an indium material pipe 44 feeding trimethylindium (TMIn) as indium source gas, a magnesium material pipe 45 feeding ethylcyclopentadienyl magnesium ($EtCp_2Mg$) as magnesium source gas and a silicon material pipe 46 feeding silane ($SiH_4$) as silicon source gas are connected to the source gas feed passage 40. Valves 51 to 56 are interposed in these material pipes 41 to 46 respectively. Each source gas is fed along with carrier gas consisting of hydrogen and/or nitrogen.

A GaN monocrystalline wafer having a major surface defined by an m-plane is held on the susceptor 32 as the wafer 35, for example. In this state, the nitrogen material valve 51 is opened while the valves 52 to 56 are kept closed, for feeding the carrier gas and ammonia gas (nitrogen source gas) into the treating chamber 30. Further, the heater 31 is so electrified as to heat the wafer 35 to a temperature of 1200° C. to 1450° C. (1300° C., for example). Thus, AlGaN semiconductors can be grown without roughening the surface of the wafer 35.

After the wafer temperature reaches 1200° C. to 1450° C., the nitrogen material valve 51, the gallium material valve 52, the aluminum material valve 53 and the silicon material valve 56 are opened. Thus, ammonia, trimethyl gallium, trimethyl aluminum and silane are fed from the source gas feed passage 40 along with the carrier gas. Consequently, the n-type AlGaN contact layer 13 made of AlGaN layer doped with silicon is grown on the surface of the wafer 35.

Then, the nitrogen material valve 51, the gallium material valve 52, the aluminum material valve 53 and the silicon material valve 56 are opened, to feed ammonia, trimethyl gallium, silane and trimethyl aluminum from the source gas feed passage 40 along with the carrier gas. Consequently, the n-type AlGaN cladding layer 14 is epitaxially grown on the n-type AlGaN contact layer 13.

Then, the nitrogen material valve 51, the gallium material valve 52, the aluminum material valve 53 and the silicon material valve 56 are opened, to feed ammonia, trimethyl gallium and silane from the source gas feed passage 40 along with the carrier gas. Consequently, the n-type AlGaN guide layer 15 is epitaxially grown on the n-type AlGaN cladding layer 14.

Then, the silicon material valve 56 is closed, to grow the light emitting layer 10 (active layer) having the multiple quantum well structure. The light emitting layer 10 can be grown by alternately carrying out the steps of growing the AlGaN layers 101 by opening the nitrogen material valve 51, the gallium material valve 52 and the aluminum material valve 53 thereby feeding ammonia, trimethyl gallium and trimethyl aluminum to the wafer 35 and growing additive-free AlGaN layers 102 by opening the nitrogen material valve 51, the gallium material valve 52 and the aluminum material valve 53 thereby feeding ammonia, trimethyl gallium and trimethyl aluminum to the wafer 35. For example, an AlGaN layer 102 (barrier layer) having a relatively high Al concentration is formed at first, and an AlGaN layer 101 (quantum well layer) having a relatively low Al concentration is formed thereon. These steps are repetitively carried out five times, for example. In the steps of forming the light emitting layer 10, the temperature of the wafer 35 is preferably set to 1200° C. to 1450° C. (1300° C., for example), for example. At this time, the growth pressure is preferably set to not more than 200 torr, so that crystallinity can be improved.

Then, the p-type electron blocking layer 16 is formed. In other words, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the p-type electron blocking layer 16 made of AlGaN doped with magnesium. In the step of forming the p-type electron blocking layer 16, the temperature of the wafer 35 is preferably set to 1200° C. to 1450° C. (1300° C., for example).

Then, the nitrogen material valve 51, the gallium material valve 52, the aluminum material valve 53 and the magnesium material valve 55 are opened. Thus, ammonia, trimethyl gallium, trimethyl aluminum and ethylcyclopentadienyl magnesium are fed toward the wafer 35, to form the guide layer 17 made of p-type AlGaN doped with magnesium. In the step of forming the p-type AlGaN guide layer 17, the temperature of the wafer 35 is preferably set to 1200° C. to 1450° C. (1300° C., for example).

Then, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the cladding layer 18 made of p-type AlGaN layer doped with magnesium. In the step of forming the p-type AlGaN cladding layer 18, the temperature of the wafer 35 is preferably set to 1200° C. to 1450° C. (1300° C., for example).

Then, the p-type contact layer 19 is formed. In other words, the nitrogen material valve 51, the gallium material valve 52 and the magnesium material valve 55 are opened, while the remaining valves 53, 54 and 56 are closed. Thus, ammonia, trimethyl gallium and ethylcyclopentadienyl magnesium are fed toward the wafer 35, to form the p-type GaN contact layer 19 made of GaN layer doped with magnesium. In the step of forming the p-type GaN contact layer 19, the temperature of the wafer 35 is preferably set to 900° C. to 1100° C. (1000° C., for example).

The layers constituting the p-type semiconductor layer 12 are preferably crystal-grown at an average growth temperature of not more than 1300° C. Thus, heat damage to the light emitting layer 10 can be reduced.

When each of the layers 10 and 13 to 19 constituting the group III nitride semiconductor multilayer structure 2 is grown on the wafer 35 (GaN monocrystalline substrate 1), the ratio V/III of the molar fraction of the nitrogen material (ammonia) to the molar fraction of the gallium material (trimethyl gallium) fed to the wafer 35 in the treating chamber 30 is kept at a level of not less than 50 and not more than 1500.

According to this embodiment, the group III nitride semiconductor multilayer structure 2 having the major surface defined by the m-plane is grown in a dislocation-free and planar state at the aforementioned ratio V/III, with no buffer layer interposed between the GaN monocrystalline substrate 1 and the group III nitride semiconductor multilayer structure 2. This group III nitride semiconductor multilayer structure 2 has neither stacking faults nor threading dislocations arising from the major surface of the GaN monocrystalline substrate 1.

Thus, the group III nitride semiconductor multilayer structure 2 is grown on the wafer 35, which in turn is transferred into an etching apparatus so that the ridge stripe 20 is formed by partially removing the p-type semiconductor layer 12 by dry etching such as plasma etching, for example. This ridge stripe 20 is so formed as to be parallel to the c-axis direction.

After the formation of the ridge stripe 20, the insulating layers 6 are formed. The insulating layer 6 is formed through a lift-off step, for example. In other words, the insulating layers 6 can be formed by forming a striped mask, thereafter forming a thin insulator film to entirely cover the p-type AlGaN cladding layer 18 and the p-type GaN contact layer 19 and thereafter lifting off the thin insulator film thereby exposing the p-type GaN contact layer 19.

Then, the p-type electrode 4 and the n-type electrode 3 are formed in ohmic contact with the p-type GaN contact layer 19 and the n-type AlGaN contact layer 13 respectively. These electrodes 3 and 4 can be formed by resistive heating or with a metal vapor deposition apparatus employing an electron beam, for example.

Then, the wafer 35 is divided into each individual device. In other words, each device constituting the semiconductor laser diode is cut by cleaving the wafer 35 in the directions perpendicular to and parallel to the ridge stripe 20 respectively. The wafer 35 is cleaved along the a-plane in relation to the direction perpendicular to the ridge stripe 20, and cleaved along the c-plane in relation to the direction parallel to the ridge stripe 20. Thus, the cavity end faces 21 and 22 are formed.

The aforementioned insulating films 23 and 24 are formed on the cavity end faces 21 and 22 respectively. These insulating films 23 and 24 can be formed by electron cyclotron resonance (ECR) film formation, for example. When a bar-shaped body is obtained by cleaving the wafer 35 in relation to the direction perpendicular to the ridge stripe 20 and the insulating films 23 and 24 are thereafter formed on a pair of side surfaces of the bar-shaped body, the insulating films 23 and 24 can be collectively formed on a plurality of laser devices. Thereafter the bar-shaped body may be cleaved along the direction parallel to the ridge stripe 20, to be divided into each chip.

While the embodiment of the present invention has been described, the present invention may be embodied in other ways. For example, while the group III nitride semiconductor multilayer structure 2 having the major growth surface defined by the m-plane forms the laser diode structure in the aforementioned embodiment, the laser diode 70 may alternatively be formed by a group III nitride semiconductor multilayer structure having a major growth surface defined by an a-plane. In this case, the cavity direction may be set along the m-axis direction (direction perpendicular to the c-axis). The group III nitride semiconductor multilayer structure having the major growth surface defined by the a-plane can be formed by epitaxially growing group III nitride semiconductors on a GaN monocrystalline substrate having a major surface defined by an a-plane, for example.

The quantum well layers, formed by the AlGaN layers 101 in the aforementioned embodiment, may alternatively be formed by AlInGaN layers, AlInN layers or AlN layers. In each case, light having a main polarization component parallel to the c-axis can be emitted by setting the Al composition to not less than 50%. Therefore, oscillation of the TE mode can be easily caused by setting the cavity direction perpendicularly to the c-axis. The composition of the AlGaN layers 102 forming the barrier layers is not restricted to the aforementioned one either, but the barrier layers can be made of $Al_{x2}In_{y2}Ga_{1-x2-y2}N$ (x2>x1, y2≧0 and 1−x2−y2<0.5) having a higher Al concentration than the quantum well layers.

Further, the thicknesses and the impurity concentrations of the layers constituting the group III nitride semiconductor multilayer structure 2 described above are mere examples, and appropriate values can be properly selected therefor. Each of the cladding layers 14 and 18 may not be formed by a single AlGaN layer, but may alternatively be constituted of a superlattice structure formed by AlGaN layers having compositions different from each other.

While the electron blocking layer 16 is arranged between the p-type guide layer 17 and the light emitting layer 10 in the aforementioned embodiment, the electron blocking layer 16 and the p-type guide layer 17 may alternatively be arranged in another way. For example, the electron blocking layer 16 may be arranged on an intermediate portion of the p-type guide layer 17 in the thickness direction (more specifically, at a generally central portion in the thickness direction), for example. The electron blocking layer 16 may be made of $Al_{x3}In_{y3}Ga_{1-x3-y3}N$ (x3>x2 and y3≧0) having a higher Al concentration than the barrier layers 102 and the p-type guide layer 17, for example.

The substrate 1 may be removed by laser lift-off or the like after the formation of the group III nitride semiconductor multilayer structure 2, so that the semiconductor laser diode has no substrate 1.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-316044 filed in the Japanese Patent Office on Dec. 6, 2007, the entire disclosure of which is incorporated herein by reference.

What is claimed is:

1. A nitride semiconductor laser diode having a quantum well layer comprising:
   a mixed crystal of $Al_{x1}In_{y1}Ga_{1-x1-y1}N$ (x1≧0.5, y1≧0 and 1−x1−y1≦0.5) in a group III nitride semiconductor multilayer structure having a major growth surface defined by a nonpolar plane, with a cavity direction perpendicular to a c-axis in an opposing direction to a laser emitting end face and a reflective end face, light reciprocating between the laser emitting end face and the reflective end face and being amplified,
   wherein the group III nitride semiconductor multilayer structure includes a multiple quantum well structure obtained by alternately stacking the quantum well layer and a barrier layer made of $Al_{x2}In_{y2}Ga_{1-x2-y2}N$ (x2>x1, y2≧0 and 1−x2−y2<0.5) having a higher Al concentration than that of the quantum well layer, and
   the laser emitting end face and the reflective end face are provided at end faces of the quantum well layer with regard to a direction perpendicular to a thickness direction of the quantum well layer so that the cavity direction along which light is emitted is parallel to the quantum well layer, wherein planarity of the major growth surface in c-axis direction is within 10 Å.

2. The nitride semiconductor laser diode according to claim 1, wherein
the cavity direction is parallel to the major growth surface.

3. The nitride semiconductor laser diode according to claim 1, wherein
the major growth surface of the group III nitride semiconductor multilayer structure is defined by an m-plane, and
the cavity direction is along an a-axis.

4. The nitride semiconductor laser diode according to claim 1, wherein
the nitride semiconductor laser diode is an ultraviolet laser generating light of an ultraviolet region.

5. The nitride semiconductor laser diode according to claim 1, wherein
the group III nitride semiconductor multilayer structure consists of group III nitride semiconductors having major crystal growth surfaces defined by m-planes, and is obtained by stacking an n-type cladding layer, a light emitting layer including the quantum well layer and a p-type cladding layer in an m-axis direction.

6. The nitride semiconductor laser diode according to claim 5, wherein
the group III nitride semiconductor multilayer structure includes a p-type semiconductor layer including the p-type cladding layer,
the nitride semiconductor laser diode further includes a p-type electrode formed along a direction perpendicular to the c-axis in contact with the p-type semiconductor layer in a striped contact region, and
a pair of cavity end faces are formed perpendicularly to the direction of the stripes of the contact region.

7. The nitride semiconductor laser diode according to claim 5, wherein
the group III nitride semiconductor multilayer structure includes a p-type semiconductor layer including the p-type cladding layer,
stripes along the direction perpendicular to the c-axis are formed by partially removing the p-type semiconductor layer, and
a pair of cavity end faces are formed perpendicularly to the direction of the stripes.

8. The nitride semiconductor laser diode according to claim 1, wherein the laser emitting end face is covered with a single film, and the reflective end face is covered with a multiple reflecting film.

9. The nitride semiconductor laser diode according to claim 8, wherein the single film is formed of $ZrO_2$.

10. The nitride semiconductor laser diode according to claim 8, wherein the multiple reflecting film is formed by alternately repetitively stacking $SiO_2$ films and $ZrO_2$ films.

11. The nitride semiconductor laser diode according to claim 1, wherein the nonpolar plane is an m-plane, and azimuth errors related to both of (0001) and (11-20) directions are within ±1°.

12. The nitride semiconductor laser diode according to claim 1, wherein the mixed crystal is grown on a monocrystalline substrate whose offset angle of a major surface is within ±1°.

13. The nitride semiconductor laser diode according to claim 1, wherein the end faces are of cleavage planes which are on a-planes.

14. The nitride semiconductor laser diode according to claim 11, wherein the azimuth error related to (0001) direction is within 0.3°.

15. The nitride semiconductor laser diode according to claim 11, wherein the azimuth error related to (11-20) direction is within 0.3°.

16. A nitride semiconductor laser diode having a quantum well layer comprising:
a mixed crystal of $Al_{x1}In_{y1}Ga_{1-x1-y1}N$ (x1≧0.5, y1≧0 and 1−x1−y1≦0.5) in a group III nitride semiconductor multilayer structure having a major growth surface defined by a nonpolar plane, with a cavity direction perpendicular to a c-axis in an opposing direction to a laser emitting end face and a reflective end face, light reciprocating between the laser emitting end face and the reflective end face and being amplified,
wherein the group III nitride semiconductor multilayer structure includes a multiple quantum well structure obtained by alternately stacking the quantum well layer and a barrier layer made of $Al_{x2}In_{y2}Ga_{1-x2-y2}N$ (x2>x1, y2≧0 and 1−x2−y2<0.5) having a higher Al concentration than that of the quantum well layer, and
the laser emitting end face and the reflective end face are provided at end faces of the quantum well layer with regard to a direction perpendicular to a thickness direction of the quantum well layer so that the cavity direction along which light is emitted is parallel to the quantum well layer.

* * * * *